United States Patent
Briggs et al.

(10) Patent No.: US 10,242,909 B2
(45) Date of Patent: Mar. 26, 2019

(54) WET ETCH REMOVAL OF RU SELECTIVE TO OTHER METALS

(71) Applicant: INTERNATIONAL BUSINESS MACHINES CORPORATION, Armonk, NY (US)

(72) Inventors: Benjamin D. Briggs, Waterford, NY (US); Cornelius B. Peethala, Albany, NY (US); David L. Rath, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/808,193

(22) Filed: Nov. 9, 2017

(65) Prior Publication Data

US 2018/0323151 A1    Nov. 8, 2018

Related U.S. Application Data

(63) Continuation of application No. 15/585,704, filed on May 3, 2017, now Pat. No. 10,090,247.

(51) Int. Cl.
*H01L 21/76* (2006.01)
*H01L 21/768* (2006.01)
(Continued)

(52) U.S. Cl.
CPC .. *H01L 21/76883* (2013.01); *H01L 21/32134* (2013.01); *H01L 21/76802* (2013.01);
(Continued)

(58) Field of Classification Search
CPC ......... H01L 21/76802; H01L 21/76804; H01L 21/76846; H01L 21/76847;
(Continued)

(56) References Cited

U.S. PATENT DOCUMENTS 5,963,814 A    10/1999  Walker et al.
6,436,723 B1    8/2002  Tomita et al.
(Continued)

FOREIGN PATENT DOCUMENTS

JP    2016-092101 A    5/2016
WO    2016/068183 A1   5/2016

OTHER PUBLICATIONS

List of IBM Patents or Patent Applications Treated as Related dated Nov. 9, 2017, 2 pages.

*Primary Examiner* — Scott B Geyer
(74) *Attorney, Agent, or Firm* — Tutunjian & Bitetto, P.C.; Vazken Alexanian

(57) ABSTRACT

A method for forming a conductive structure for a semiconductor device includes depositing a barrier layer in a trench formed in a dielectric material and forming an interface layer over the barrier layer. A main conductor is formed over the interface layer, and the main conductor is recessed selectively to the interface layer and the barrier layer to a position below a top surface of the dielectric layer. The interface layer is selectively wet etched to the main conductor and the barrier layer using a chemical composition having an oxidizer, wherein the chemical composition is buffered to include a pH above 7. The barrier layer is selectively etching to the main conductor and the interface layer.

22 Claims, 8 Drawing Sheets

(51) Int. Cl.
*H01L 21/3213* (2006.01)
*H01L 23/532* (2006.01)

(52) U.S. Cl.
CPC .. *H01L 21/76804* (2013.01); *H01L 21/76846* (2013.01); *H01L 21/76847* (2013.01); *H01L 21/76853* (2013.01); *H01L 21/76861* (2013.01); *H01L 21/76865* (2013.01); *H01L 21/76871* (2013.01); *H01L 21/76892* (2013.01); *H01L 23/53238* (2013.01)

(58) Field of Classification Search
CPC ......... H01L 21/76853; H01L 21/76861; H01L 21/76865; H01L 21/76871; H01L 21/76877; H01L 21/76883; H01L 21/76892
See application file for complete search history.

(56) References Cited

U.S. PATENT DOCUMENTS

| | | | |
|---|---|---|---|
| 6,586,161 B2 | 7/2003 | Futase et al. | |
| 6,737,221 B2 | 5/2004 | Futase et al. | |
| 7,223,685 B2 * | 5/2007 | Andryushchenko | C25F 3/02 257/E21.01 |
| 7,605,082 B1 * | 10/2009 | Reid | C23C 18/1607 257/E21.076 |
| 7,964,509 B2 | 6/2011 | Futase et al. | |
| 8,034,717 B2 | 10/2011 | Futase et al. | |
| 8,293,648 B2 | 10/2012 | Futase et al. | |
| 9,324,650 B2 | 4/2016 | Edelstein et al. | |
| 2005/0101134 A1 | 5/2005 | Brask et al. | |
| 2006/0240187 A1 * | 10/2006 | Weidman | C23C 16/0272 427/248.1 |
| 2007/0099422 A1 * | 5/2007 | Wijekoon | C23C 18/165 438/687 |
| 2009/0280649 A1 * | 11/2009 | Mayer | B23H 5/08 438/676 |
| 2012/0009800 A1 | 1/2012 | Futase et al. | |
| 2014/0252616 A1 * | 9/2014 | Lin | H01L 23/48 257/751 |
| 2014/0327140 A1 * | 11/2014 | Zhang | H01L 21/76843 257/751 |
| 2015/0267306 A1 * | 9/2015 | Mayer | C23F 1/02 252/79.4 |
| 2017/0207112 A1 * | 7/2017 | Huang | H01L 23/53214 |

* cited by examiner

WET ETCH REMOVAL OF RU SELECTIVE TO OTHER METALS

BACKGROUND

Technical Field

The present invention generally relates to semiconductor processing, and more particularly to wet etching metals, such as Ru, selectively with respect to other metals or metal containing films or materials.

Description of the Related Art

Ruthenium (Ru) metal is an important material in semiconductor device fabrication. Ruthenium layers, films, and other structures can be incorporated into semiconductor components and elements such as electrical contacts, conductive liners, diffusion barriers, electrodes, and other structures. Ruthenium may be applied by chemical or physical vapor deposition techniques to provide a surface coating having wear or corrosion resistant properties.

Ruthenium metal can be applied as a thin film by sputter deposition or as a conformal layer by metal organic chemical vapor deposition. Ruthenium is a conductive metal that oxidizes to form a conductive ruthenium dioxide ($RuO_2$) layer on the surface of the existing ruthenium metal. This provides an additional advantage when an oxide is formed. Ruthenium will not form a dielectric layer when oxidized to $RuO_2$. This distinguishes Ru from other conductive metal film materials such as, for example, tungsten, tantalum, and titanium, all of which form relatively non-conductive oxide layers.

In fabricating semiconductor devices incorporating Ru metal films, it may be necessary to etch, pattern, dissolve, or otherwise remove at least a portion of the ruthenium metal film or its dioxide so as to provide a suitably configured electrode or other structure. However, both Ru metal and ruthenium dioxide are resistant to removal by known wet etching techniques, and none of the common wet etchants employed in semiconductor device processing dissolve Ru as Ru is insoluble in strong acids and oxidizers and as is soluble only in molten alkali salts or harsh etchants unsuitable for many applications, including semiconductor processing.

If a layer or film of Ru metal or ruthenium dioxide needs to be etched or patterned for a semiconductor device, a dry etch is employed. The dry etch can include argon plasma and/or $O_2$ plasma. Dry etching to remove Ru can result in the formation of ruthenium tetroxide ($RuO_4$). Ruthenium tetroxide needs be removed or otherwise prevented from building to dangerous levels (as ruthenium tetroxide can be the explosive) during the dry etch. Also, $RuO_4$ is toxic and is considered a health hazard. Such procedures can increase the complexity and expense of the Ru processing.

The use of Ru has been limited because of the difficulties associated with etching or patterning the Ru structures using wet etching and the disadvantages resulting from the use of dry etching. In addition, the removal the Ru selective to other metals or materials further complicates the processing of Ru.

SUMMARY

In accordance with an embodiment of the present invention, a method for forming a conductive structure for a semiconductor device includes depositing a barrier layer in a trench formed in a dielectric material and forming an interface layer over the barrier layer. A main conductor is formed over the interface layer, and the main conductor is recessed selectively to the interface layer and the barrier layer to a position below a top surface of the dielectric layer. The interface layer is selectively wet etched to the main conductor and the barrier layer using a chemical composition having an oxidizer, wherein the chemical composition is buffered to include a pH above 7. The barrier layer is selectively etching to the main conductor and the interface layer.

Another method for forming a conductive structure for a semiconductor device includes depositing a barrier layer in a trench formed in a dielectric material; forming a ruthenium (Ru) interface layer over the barrier layer; forming a main conductor over the interface layer; recessing the main conductor selectively to the interface layer and the barrier layer to a position below a top surface of the dielectric layer; wet etching the interface layer selectively to the main conductor and the barrier layer using a chemical composition including an oxidizer, a buffer agent, a pH adjusting agent in an amount sufficient to provide a basic pH; and etching the barrier layer selectively to the main conductor and the interface layer.

Yet another method for forming a conductive structure for a semiconductor device includes depositing a barrier layer in a trench formed in a dielectric material; forming an interface layer over the barrier layer; forming a main conductor over the interface layer; concurrently recessing the main conductor and the interface selectively to the barrier layer to a position below a top surface of the dielectric layer by wet etching using a chemical composition having an oxidizer and complexing agent, wherein the chemical composition is buffered to include a basic pH; and etching the barrier layer selectively to the main conductor and the interface layer.

Still another method for forming a conductive structure for a semiconductor device includes depositing a barrier layer in a trench formed in a dielectric material; forming a ruthenium (Ru) interface layer over the barrier layer; forming a copper (Cu) main conductor over the interface layer; concurrently recessing the main conductor and the interface selectively to the barrier layer to a position below a top surface of the dielectric layer by wet etching using a chemical composition having an oxidizer, a buffer agent, a complexing agent and a pH adjusting agent in an amount sufficient to provide a basic pH; and etching the barrier layer selectively to the main conductor and the interface layer.

A semiconductor device includes a substrate including semiconductor components and a dielectric layer formed over the substrate. A barrier layer is formed in a trench formed in the dielectric layer. A ruthenium (Ru) interface layer is formed over the barrier layer, and a main conductor is formed over the interface layer. A recess is formed by recessing the barrier layer, the interface layer and the main conductor in the trench below a top surface of the dielectric layer wherein the barrier layer is recessed to a same level as a common surface of the main conductor and the interface layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
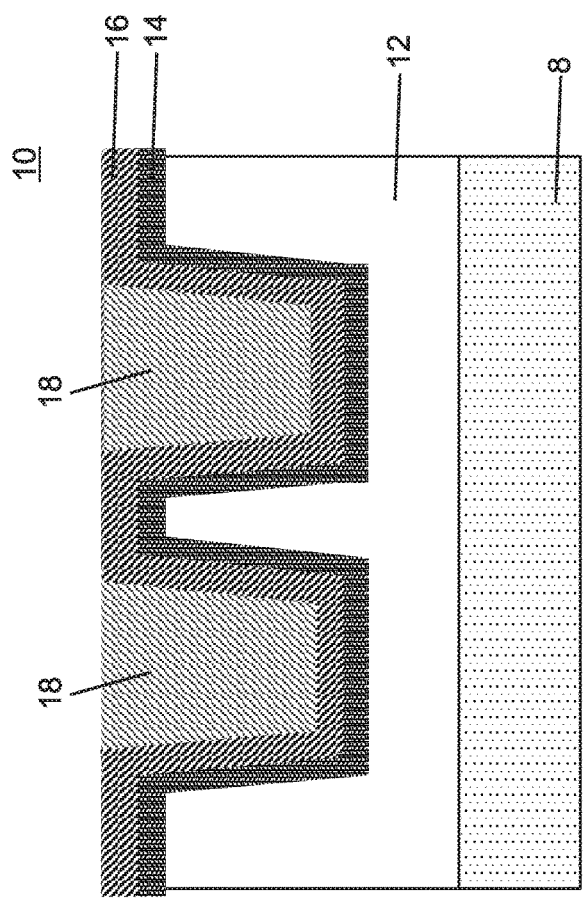
FIG. 1 is a cross-sectional view showing a semiconductor device having conductive structures formed in trenches where the conductive structures include a barrier layer, an interface layer and a main conductor in accordance with an embodiment of the present invention.

In accordance with aspects of the present invention, methods are provided for recessing, etching, patterning, dissolving, or otherwise removing all or a portion of a film, layer, deposit, or other structure including ruthenium metal and/or ruthenium dioxide. In one embodiment, the etching of ruthenium includes a wet etching process that includes chemical mixtures that can remove the ruthenium selective to other materials of a semiconductor device.

In one embodiment, the wet etch permits the removal of ruthenium selectively to other metals or metal-containing barrier/liner materials often employed in forming metal lines and vias in semiconductor devices. In a particularly useful embodiment, a trench formed for the formation of a metal line can include a barrier of, e.g., TaN with a layer of Ru formed thereon. To create a via aligned to the metal line, a recess process is performed in accordance with the present embodiments. The recess removes the portions of the Ru liner selective to the TaN barrier and the Cu in the trench. In other embodiments, the Ru and Cu can be etched selectively to the TaN.

In accordance with one embodiment, the wet etchant includes a mixture of an oxidizer, a buffer agent, an optional complexing agent and a pH adjusting chemical. The mixture preferably includes a basic pH, preferably about 9.0, although any pH of 4 or more may be employed. In particularly useful embodiments, the oxidizer can include periodic acid, potassium periodate, sodium periodate; the buffer agent can include boric acid and the pH adjusting agent can include potassium hydroxide, sodium hydroxide, or lithium hydroxide. The wet etch process can be employed at room temperature, although elevated temperatures up to about 65° C. can also be employed. The wet etch process selectively removes Ru (and/or Cu) without damaging the dielectric materials (e.g., SiCOH, $Si_3N_4$, SiCN, SiNO, $SiO_2$) in which the trench is formed. In some embodiments, the dielectric material can include ultra-low-k dielectric (e.g., porous SiCOH) material. The wet etching can be tunable with respect to the Cu etching.

In one example where a recess is formed to remove portions of the Ru liner selective to the TaN liner and Cu, the mixture can include, e.g., 10 mM periodic acid ($H_5IO_6$) as the oxidizer, 10 mM boric acid ($H_3BO_3$) as the buffer agent and KOH as the pH adjusting agent in an amount sufficient to provide a pH range of 4 and above, preferably basic and more preferably 9 to 11, and even more preferably about 9.0. In other embodiments, the Ru and Cu can be etched selectively to the TaN.

In this example, the mixture can include, e.g., 10 mM periodic acid ($H_5IO_6$) as the oxidizer, 10 mM boric acid ($H_3BO_3$) as the buffer agent, 2.5 mM of amino-butyric as the complexing agent and KOH as the pH adjusting agent in an amount sufficient to provide a pH of about 9.0. In another example, the pH range is 4 and above, preferably basic, e.g., between pH 7 to 11, with 10 mM potassium periodate as oxidizer, 10 mM sodium periodate as the buffer agent and with NaOH as the pH adjusting agent.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The present embodiments will now be illustratively described in terms of a particularly useful metal structure that can be employed in semiconductor devices. The present examples describe a structure that is particularly useful for 7 nm nodes and smaller, although the present embodiments can be employed for any size node or critical dimension.

Referring now to the drawings in which like numerals represent the same or similar elements and initially to FIG. 1, an illustrative semiconductor device 10 includes and interlevel dielectric (ILD) layer 12. The interlevel dielectric layer 12 can be formed over or on a substrate or substrate layer 8. The substrate 8 can include multiple layers formed thereon. The substrate 8 can include any suitable substrate structure, e.g., a bulk semiconductor, a semiconductor-on-insulator (SOI) substrate, etc. In one example, the substrate 8 can include a silicon-containing material. Illustrative examples of Si-containing materials suitable for the substrate 8 can include, but are not limited to, Si, SiGe, SiGeC, SiC and multi-layers thereof. Although silicon is the predominantly used semiconductor material in wafer fabrication, alternative semiconductor materials can be employed as additional layers or as a substrate, such as, but not limited to, germanium, gallium arsenide, gallium nitride, silicon germanium, cadmium telluride, zinc selenide, etc.

The substrate 8 can include transistors, diodes, capacitors, wires, or any other useful structures or devices formed in or thereon. Additional levels of dielectric materials and metallizations can also be present in the substrate layer 8.

The interlevel dielectric layer 12 can include silicon containing materials such as, e.g., $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H. Additional choices for the interlevel dielectric layer 12 include any of the aforementioned materials in porous form, or in a form that changes during processing to or from being porous and/or permeable to being non-porous and/or non-permeable. In one useful embodiment, the interlevel dielectric layer 12 includes an ultra-low k dielectric material, which can include SiCOH or other suitable materials.

The interlevel dielectric layer 12 is patterned to form trenches in accordance with a lithographic processing technique. In this embodiment, the trenches are lined with a barrier layer 14. The barrier layer 14 can be conformally deposited using a chemical vapor deposition (CVD) process, atomic layer deposition (ALD), physical vapor deposition (PVD) or similar process. The barrier layer can include TaN, although other suitable barrier layers may be employed. In one embodiment, the barrier layer 14 includes a thickness of between about 10 Angstroms (Å) and about 40 Å.

The barrier layer 14 is covered with an interface layer 16 that is conformally formed over the barrier layer 14 using a CVD process, PVD, ALD, sputtering or other process. The interface layer 16 can include Ru or other conductive material. In one embodiment, the interface layer 16 includes a thickness of between about 10 Å and about 40 Å.

The interface layer 16 provides a transition between the barrier layer 14 and a main conductor 18. The interface layer 16 in combination with barrier layer 14 further provides an oxidation barrier to ensure that conductivity remains even under oxidation conditions. Ru is well suited for this task as $RuO_2$ remains almost as conductive as Ru metal. Other embodiments can include other materials such as platinum (Pt), which has similar properties as Ru. In addition, the interface layer 16 provides an adhesion layer between the main conductor 18 and the barrier layer 14.

A conductor 18 can include a PVD seed layer and electroplated over burden formed on the interface layer 16. The seed layer can be deposited using a CVD process, PVD, sputtering or other process. The conductor 18 includes a metal or material of high conductivity, such as Cu. A planarization process can be employed, such as, e.g., chemical mechanical polishing (CMP) to remove overburden from the deposition of the main conductor 18.

To provide a fully aligned via to the main conductor 18 (especially for node sizes beyond 7 nm), topography, such as, a recess needs to be created so that the via can be formed in the recess for self-alignment.

Figure 2:
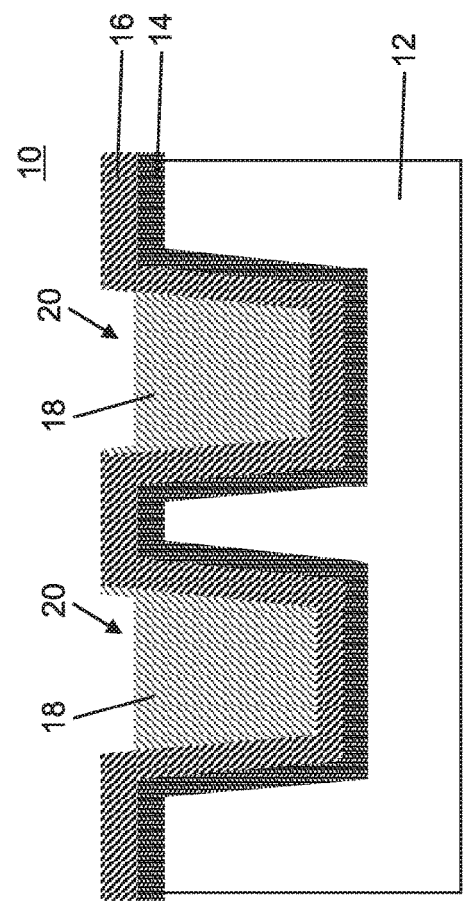
FIG. 2 is a cross-sectional view showing the semiconductor device of FIG. 1 having the main conductors of the conductive structures recessed into the trenches by a wet etch process selective to an interface layer and a barrier layer in accordance with one embodiment of the present invention.

Referring to FIG. 2, a recess 20 is formed by etching the main conductor 18 with respect to the interface layer 16. In accordance with one embodiment, the main conductor 18 includes Cu and the interface layer 16 includes Ru. The etching of the main conductor 18 to form recesses 20 can include a wet etch. The wet etch can include a standard clean 1 process (SC1) followed by a diluted HF etch.

Figure 3:
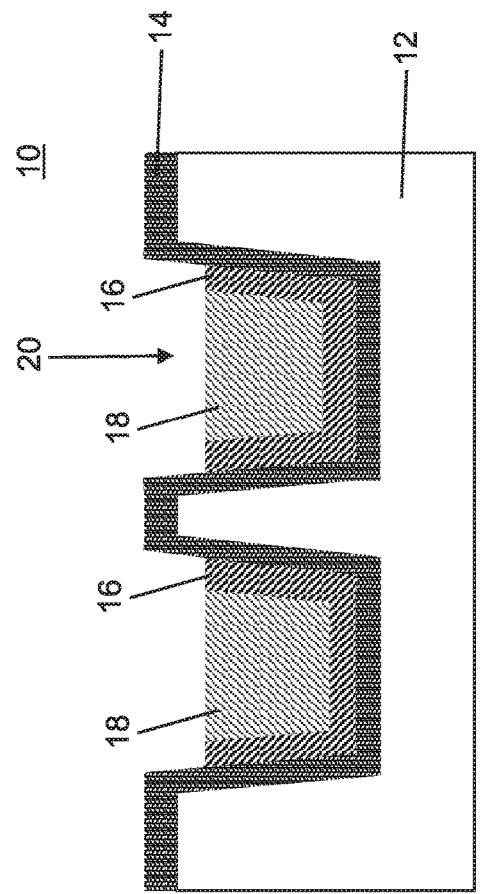
FIG. 3 is a cross-sectional view showing the semiconductor device of FIG. 2 having the interface layer of the conductive structures, which can include ruthenium (Ru) etched into the trenches by a wet etch process including a chemical composition having an oxidizer, a buffer agent and a pH adjusting chemical or agent in accordance with one embodiment of the present invention.

Referring to FIG. 3, to further the formation of the recess 20 the interface layer 16 needs to be etched. The interface layer 16 can be wet etched using a chemical composition that provides wet removal of the interface layer 16 selective to the main conductor 18 and the barrier layer 14. In a particularly useful embodiment, the wet removal of the interface layer 16 selective to the main conductor 18 and the barrier layer 14 includes wet removal of Ru selective to Cu and TaN.

The chemical composition can include a wet etchant mixture having an oxidizer, a buffer agent and a pH adjusting chemical. The mixture preferably includes a pH of 4 and above preferably basic pH, and more preferably about 9.0, which can be adjusted based on the pH adjusting chemical. In one embodiment, the oxidizer can include periodic acid; the buffer agent can include boric acid; and the pH adjusting agent can include potassium hydroxide. The wet etch process can be employed at room temperature, although elevated temperatures up to about 65° C. can also be employed. The wet etch process selectively removes Ru of the interface layer 16 without damaging the dielectric materials of interlevel dielectric layer 12, the main conductor 18 (e.g., Cu) and the barrier layer (e.g., TaN).

In one example where the recess 20 is formed to remove portions of the Ru liner selective to the TaN liner and Cu, the wet etch mixture can include, e.g., 10 mM periodic acid ($H_5IO_6$) as the oxidizer, 10 mM boric acid ($H_3BO_3$) as the buffer agent and KOH as the pH adjusting agent in an amount sufficient to provide a pH of 4 or greater, preferably basic (greater than 7) and more preferably about 9.0. The mixture removes the exposed portions of the interface layers and recesses the interface layer 16 to a level of the main conductor 18. In another embodiment, the pH range is greater than 7, but can be between pH 7 to 11. In another embodiment, the wet etch mixture can include 10 mM potassium periodate as oxidizer, 10 mM sodium periodate as the buffer agent and with NaOH as the pH adjusting agent.

Figure 4:
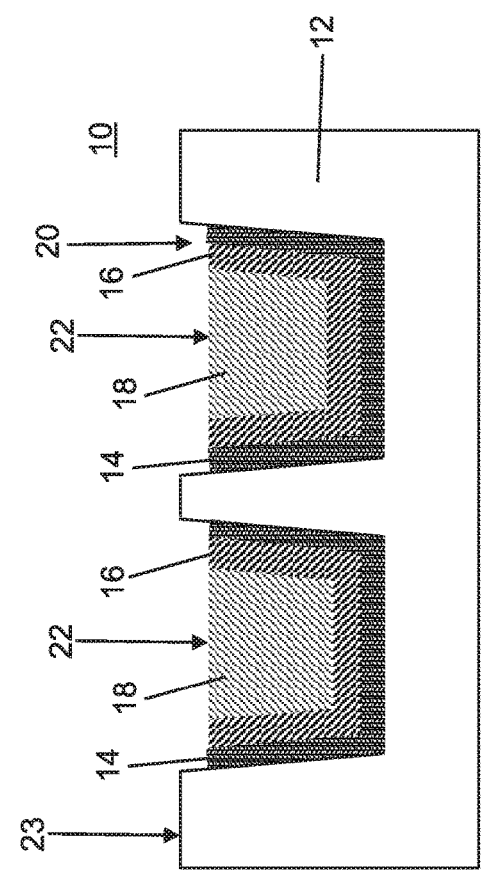
FIG. 4 is a cross-sectional view showing the semiconductor device of FIG. 3 having the barrier layer of the conductive structures etched into the trenches by a wet etch process in accordance with one embodiment of the present invention.

Referring to FIG. 4, exposed portions of the barrier layer 14 are now removed selective to the interface layer 16, the main conductor 18 and the interlevel dielectric layer 12. The barrier layer 14 can be removed by a wet etch that selectively removes the barrier layer 14 with respect to the conductor materials (e.g., Cu and Ru) and the dielectric materials of the ILD layer 12. Wet etching of the barrier materials can include an oxidizer (for example, hydrogen peroxide), a hydroxide (for example, potassium hydroxide), a corrosion inhibitor (for example, benzotriazole) or combinations thereof at elevated temperatures (e.g., about 40 to about 70° C.).

Once the barrier layer 14 is etched the barrier layer 14, the interface layer 16 and the main conductor 18 share a level surface 22. The level surface 22 is recessed below a top surface 23 of the dielectric layer 12. In this way, topography is created to assist in self-aligning a next metal material to be formed.

Figure 5:
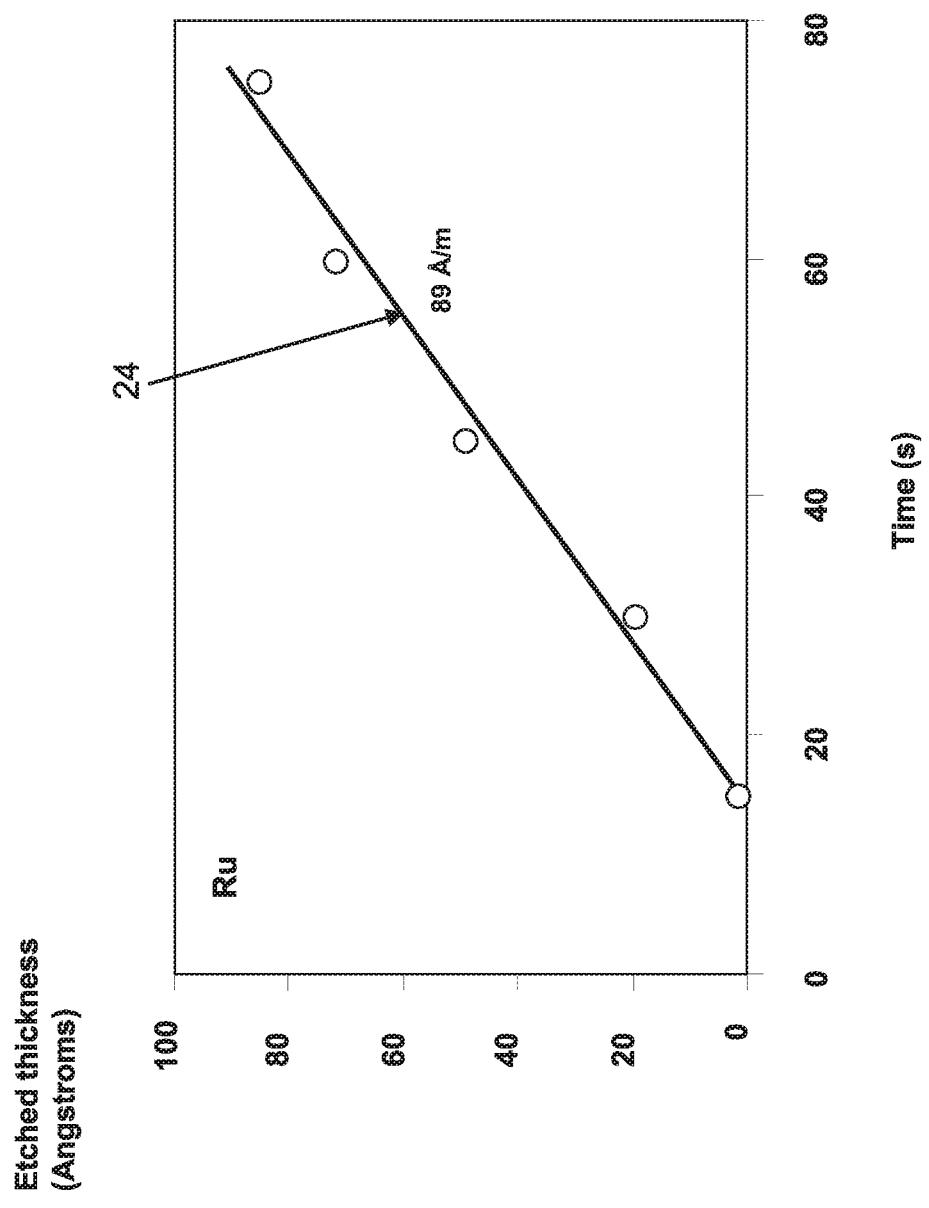
FIG. 5 is a graph plotting etched thickness (Angstroms) versus time (seconds) for a Ru wet etch process including a chemical composition having an oxidizer, a buffer agent and a pH adjusting chemical or agent in accordance with one embodiment of the present invention.

Referring to FIG. 5, a graph shows etched thickness in Å versus time (seconds) and includes a best fit curve 24 to provide an etch rate (slope of the line) for Ru using a blanket wet etch with the mixture described with respect to FIG. 3. In the example where the recess 20 is formed to remove portions of the Ru liner selective to the TaN liner and Cu, the wet etch mixture that includes, e.g., 10 mM periodic acid ($H_5IO_6$) as the oxidizer, 10 mM boric acid ($H_3BO_3$) as the buffer agent and KOH as the pH adjusting agent in an amount sufficient to provide a pH 9.0 provided an etch rate for Ru of about 89 Å/minute, which is significant especially for semiconductor devices which employ Ru layers on the order of 30 Å. Acceptable etch rates can be 10 Å/minute or greater. It should be understood that the experimental results are illustrative and that other etch rates can be achieved in accordance with adjustments and conditions.

Figure 6:
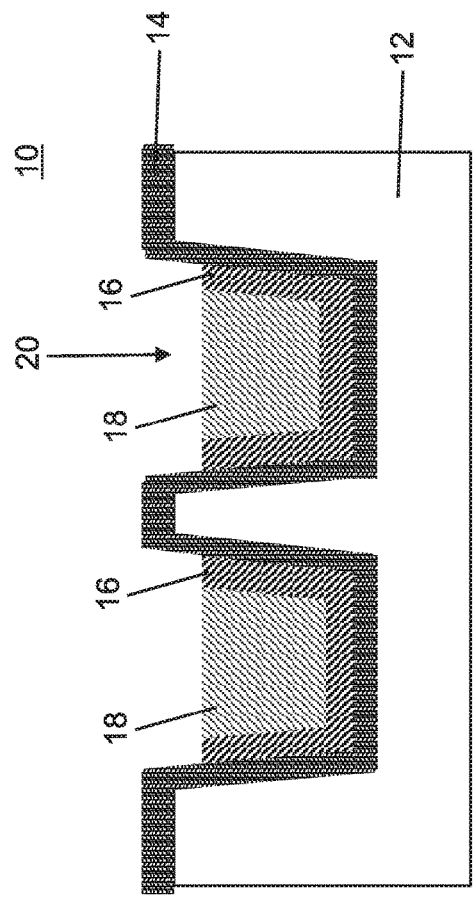
FIG. 6 is a cross-sectional view showing the semiconductor device of FIG. 1 having the interface layer and the main conductor of the conductive structures, which can include ruthenium (Ru) and copper (Cu), respectively, recessed into the trenches by a wet etch process including a chemical composition having an oxidizer, a buffer agent, a complexing agent and a pH adjusting chemical or agent in accordance with one embodiment of the present invention.

Referring to FIG. 6, beginning with the structure of FIG. 1, a recess 20 is formed by etching the main conductor 18 and the interface layer 16 together with respect to the barrier layer 14. In accordance with one embodiment, the main conductor 18 includes Cu and the interface layer 16 includes Ru. The etching of the main conductor 18 and the interface layer 16 to form recesses 20 can include a wet etch. The wet etch can include a chemical composition that provides wet removal of the interface layer 16 concurrently with the recessing of the main conductor 18 selective to the barrier layer 14 (and the dielectric layer 12). In a particularly useful embodiment, the wet removal of the interface layer 16 and main conductor 18 selective to the barrier layer 14 includes wet removal of Ru and Cu selective to TaN.

The chemical composition can include a wet etchant mixture having an oxidizer, a buffer agent, a complexing agent and a pH adjusting chemical. The mixture preferably includes a basic pH, preferably about 9.0, which can be adjusted based on the pH adjusting chemical. In one embodiment, the oxidizer can include periodic acid; the buffer agent can include boric acid; the complexing agent can include amino-butyric and the pH adjusting agent can include potassium hydroxide. The wet etch process can be employed at room temperature, although elevated temperatures can also be employed. The wet etch process selectively removes Ru of the interface layer 16 and Cu of the main conductor 18 without damaging the dielectric materials of interlevel dielectric layer 12, and the barrier layer (e.g., TaN).

In one example, the mixture can include, e.g., 10 mM periodic acid ($H_5IO_6$) as the oxidizer, 10 mM boric acid ($H_3BO_3$) as the buffer agent, 2.5 mM of amino-butyric as the complexing agent and KOH as the pH adjusting agent in an amount sufficient to provide a pH of about 9.0. The mixture removes the exposed portions of the interface layer 16 and main conductor 18 for a given amount of time until the main conductor 18 and the interface layer 16 are recessed to a predetermined height within the trenches of the dielectric layer 12.

Figure 7:
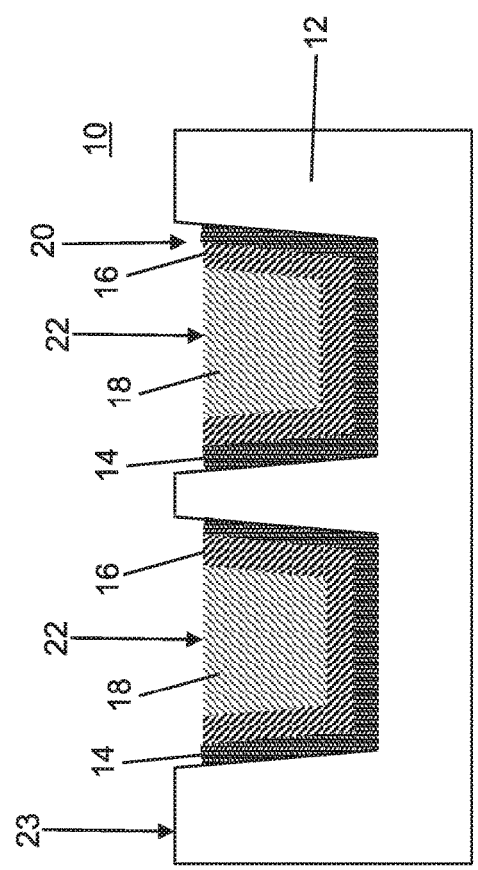
FIG. 7 is a cross-sectional view showing the semiconductor device of FIG. 6 having the barrier layer of the conductive structures etched into the trenches by a wet etch process in accordance with one embodiment of the present invention.

Referring to FIG. 7, exposed portions of the barrier layer 14 are now removed selective to the interface layer 16, the main conductor 18 and the interlevel dielectric layer 12. The barrier layer 14 can be removed by a wet etch that selectively removes the barrier layer 14 with respect to the conductor materials (e.g., Cu and Ru) and the dielectric materials of the ILD layer 12. Wet etching of the barrier materials can include an oxidizer (for example, hydrogen peroxide), a hydroxide (for example, potassium hydroxide), a corrosion inhibitor (for example, benzotriazole) or combinations thereof at elevated temperatures (about 40 to about 70° C.).

Once the barrier layer 14 is etched, the barrier layer 14, the interface layer 16 and the main conductor 18 share a level surface 22. The level surface 22 is recessed below a top surface 23 of the dielectric layer 12. In this way, topography is created to assist in self-aligning a next metal material to be formed.

Figure 8:
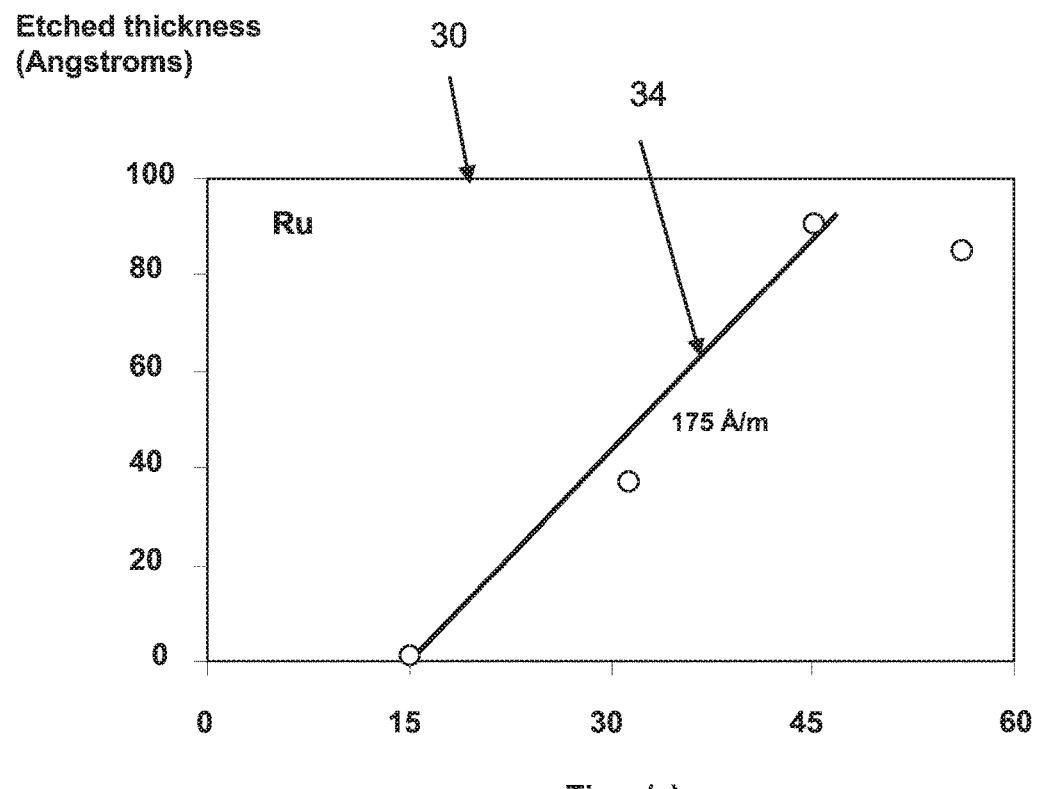
FIG. 8 are graphs plotting etched thickness (Angstroms) versus time (seconds) for Ru and Cu for wet etching processes including a chemical composition having an oxidizer, a buffer agent, a complexing agent and a pH adjusting chemical or agent in accordance with one embodiment of the present invention.
Figure 8:
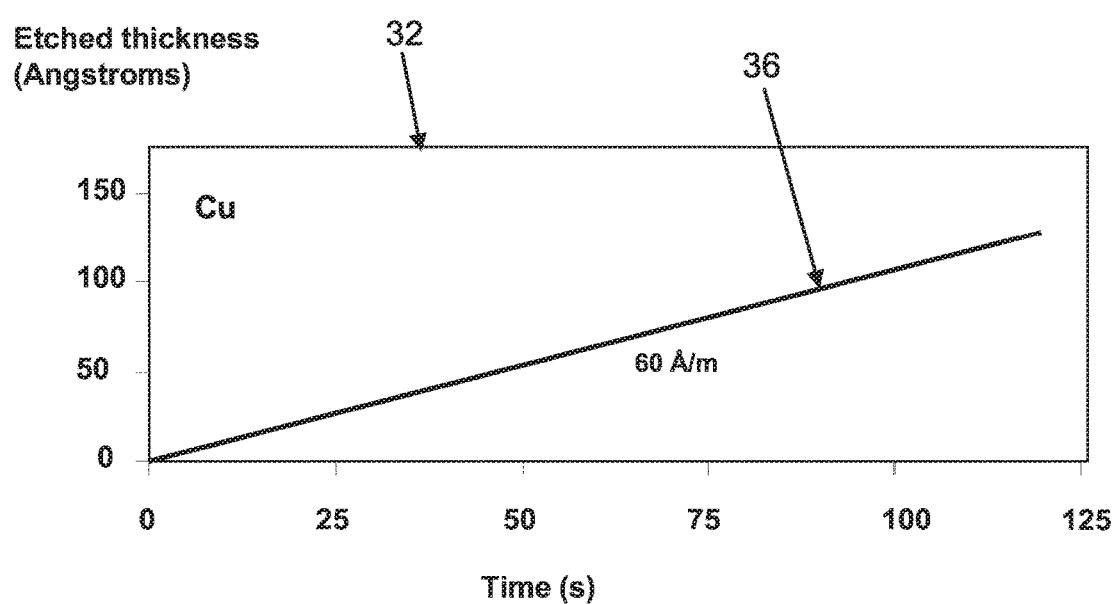

Referring to FIG. 8, a graph 30 shows etched thickness in Å versus time (seconds) and includes a best fit curve 32 to provide an etch rate (slope of the line) for Ru using a blanket wet etch with the mixture described with respect to FIG. 6. Further, a graph 32 shows etched thickness in Å versus time (seconds) and includes a best fit curve 36 to provide an etch rate (slope of the line) for Cu using a blanket wet etch with the mixture described with respect to FIG. 6. In the example where the recess 20 is formed to remove portions of the Ru liner and Cu conductor selective to the TaN liner, the wet etch mixture that included, e.g., 10 mM periodic acid ($H_5IO_6$) as the oxidizer, 10 mM boric acid ($H_3BO_3$) as the buffer agent, 2.5 mM of amino-butyric as the complexing agent and KOH as the pH adjusting agent in an amount sufficient to provide a pH 9.0 provided an etch rate for Ru of about 175 Å/minute and an etch rate for Cu of about 60 Å/minute. This provides Ru:Cu selectivity of about 3:1. It should be understood that the experimental results are illustrative and that other etch rates can be achieved in accordance with adjustments and conditions.

Figure 9:
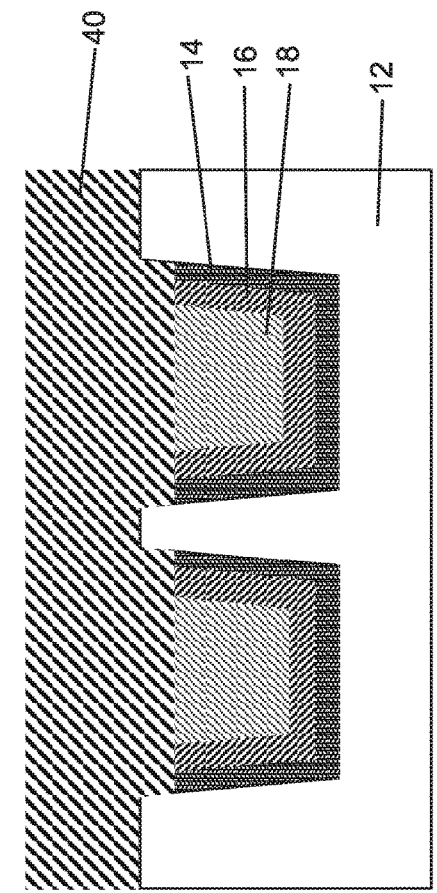
FIG. 9 is a cross-sectional view showing the semiconductor device of FIG. 3 or FIG. 6 having a dielectric layer formed over the conductive structures in accordance with one embodiment of the present invention.

Referring to FIG. 9, processing can continue from either of FIG. 4 or FIG. 7 with the formation of another dielectric layer 40. The dielectric layer 40 can include the same materials and/or processing as the interlevel dielectric layer 12. The dielectric layer 40 can include an ultra-low dielectric constant (ULK) layer although any suitable dielectric materials can be employed. The dielectric layer 40 fills in the recesses over the conductive materials (14, 16, 18).

Figure 10:
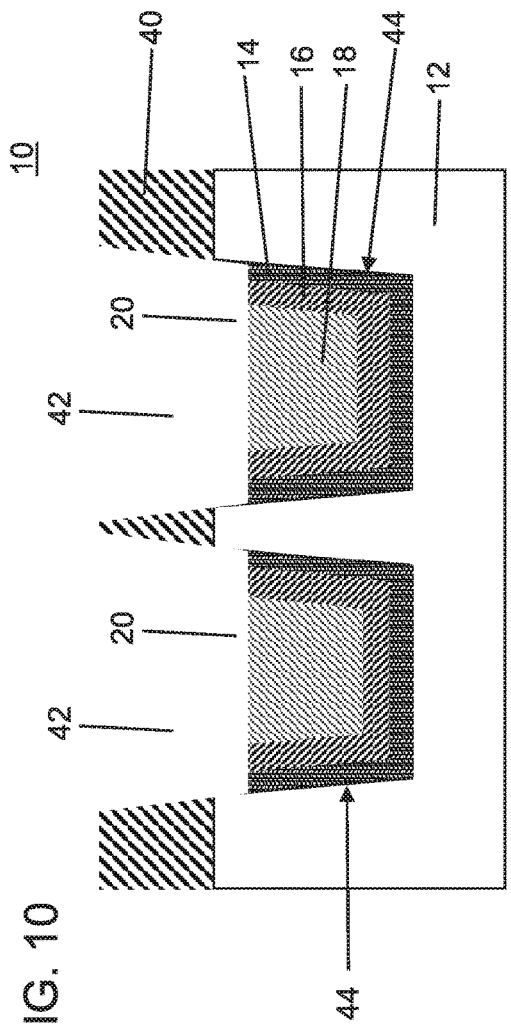
FIG. 10 is a cross-sectional view showing the semiconductor device of FIG. 9 having the dielectric layer patterned to open up and expose the conductive structures for self-aligning a metal conductor to the conductive structures in accordance with one embodiment of the present invention.

Referring to FIG. 10, the dielectric layer 40 is patterned to form trenches 42 in accordance with a lithographic processing technique. In this embodiment, the trenches 42 are aligned with the recesses 20 to permit subsequent formation of connecting metal or vias within the trenches 42 that can connect with conductive materials (14, 16, 18).

Figure 11:
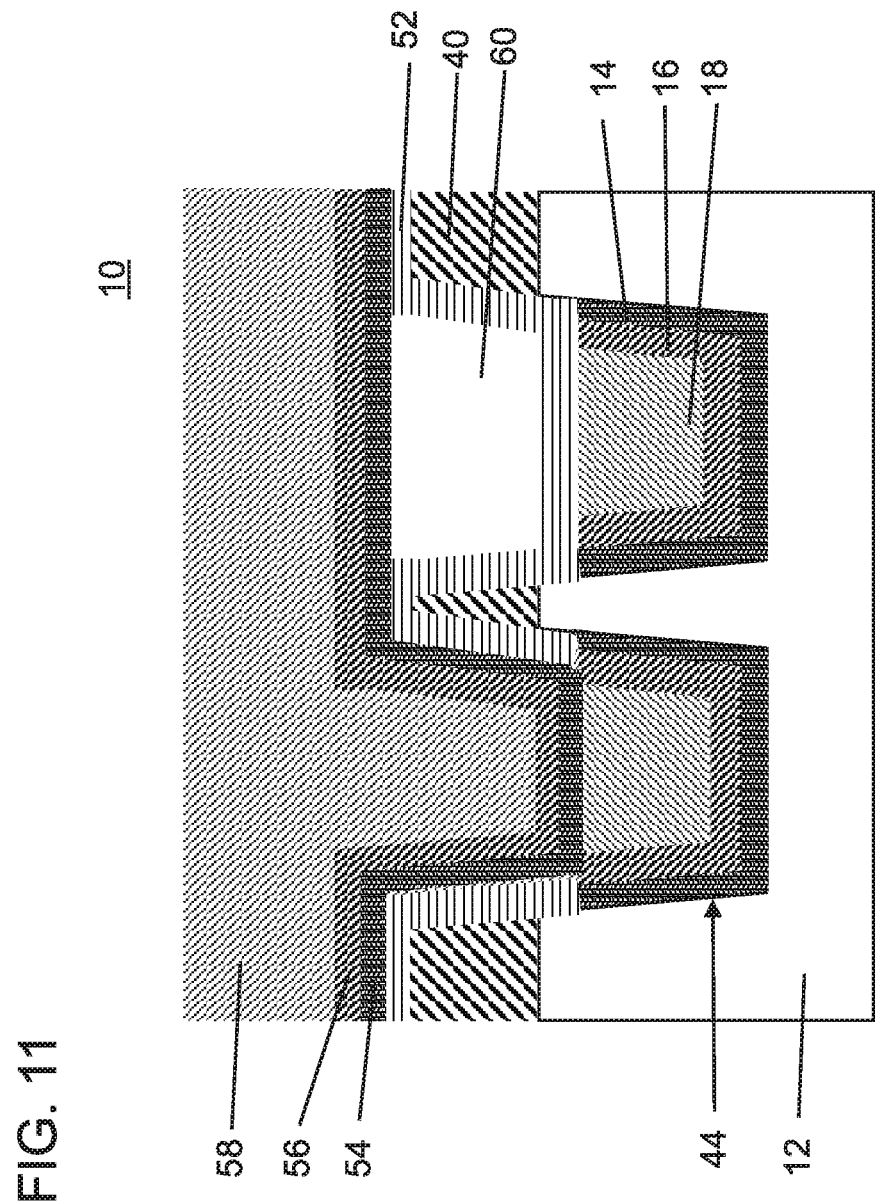
FIG. 11 is a cross-sectional view showing the semiconductor device of FIG. 10 having another layer of self-aligned conductive structures formed in accordance with one embodiment of the present invention.

Referring to FIG. 11, in one illustrative example, a conformal dielectric layer 52 is formed over the structures and removed from horizontal surfaces where a conductive path is needed. Conformal dielectric layer 52 can include SiN or similar materials. Some recesses 20 (FIG. 10) are filed with a dielectric material 60. Dielectric material 60 can include the same material as dielectric material 12. The trenches can be lined with a barrier layer 54. The barrier layer 54 can be conformally deposited. The barrier layer can include TaN, although other suitable barrier layers may be employed. The barrier layer 54 can be covered with an interface layer 56 that is conformally formed over the barrier layer 54. The interface layer 56 can include Ru or other conductive material. A main conductor 58 can be formed on the interface layer 56. The conductor 58 can include a metal or material of high conductivity, such as Cu. A planarization process (e.g., CMP) can be employed to remove overburden from the deposition of the main conductor 58.

To provide a fully aligned via or metal line to the main conductor 18 (especially for node sizes beyond 7 nm), the topography, such as, the recess 20 is employed to ensure alignment between a conductive structure 44 and the conductor 58.

Figure 12:
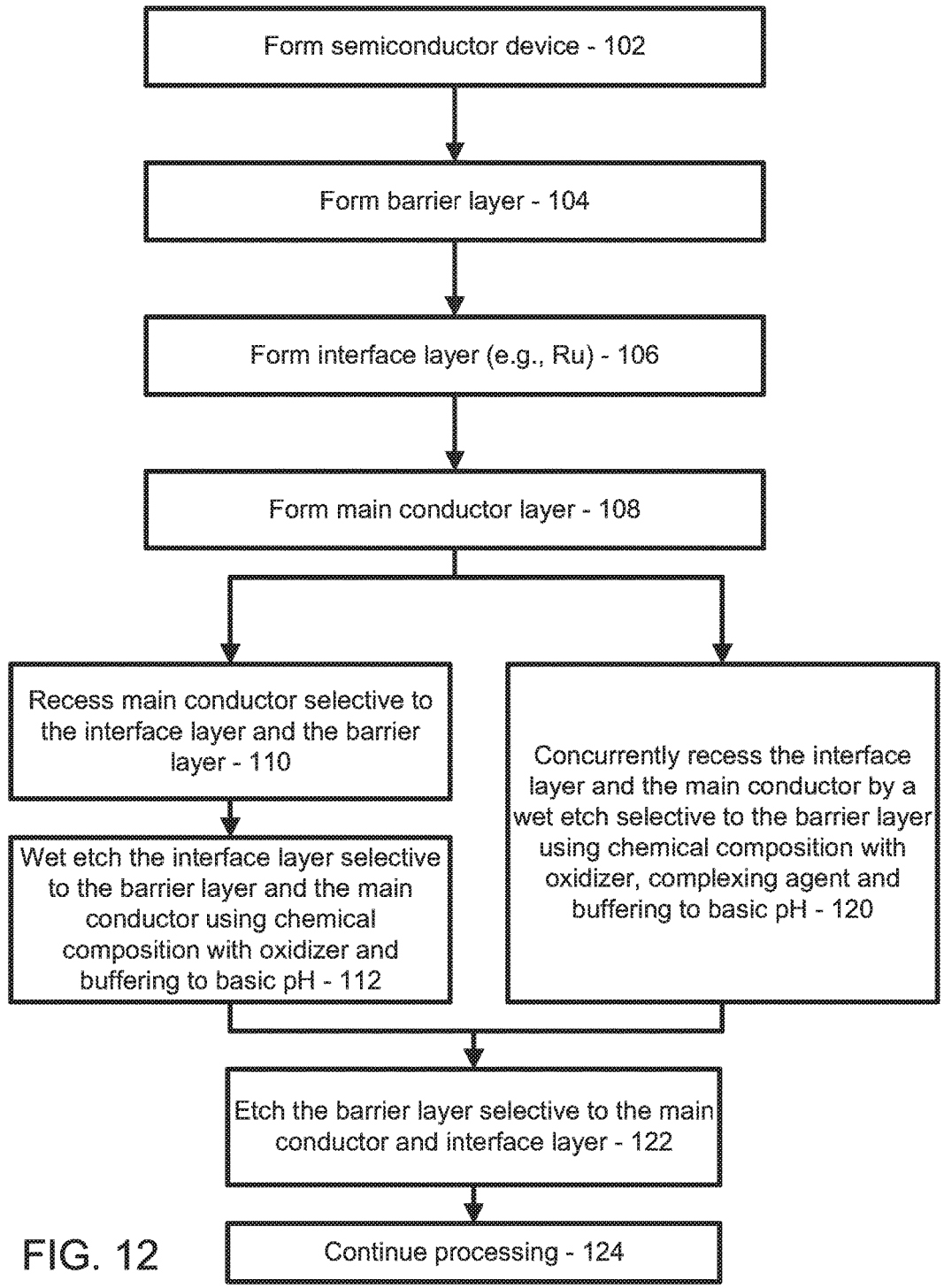
FIG. 12 is a block/flow diagram showing methods for forming a conductor structure in accordance with embodiments of the present invention.

Referring to FIG. 12, methods for forming a conductive structure for a semiconductor device are illustratively shown in accordance with aspects of the present invention. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a semiconductor device is fabricated on a substrate. The device can include any type of device, e.g., a processor, a memory device, etc. A dielectric layer is formed over the substrate. Trenches or openings are formed in the dielectric layer. The trenches or openings can be formed by lithographic patterning or other patterning techniques. In block 104, a barrier layer is deposited in the trenches (or openings) formed in dielectric material of the dielectric layer. The barrier layer can include Ta, TaN or other barrier materials.

In block 106, an interface layer is formed over the barrier layer. The interface layer can include Ru or other adhesion material/metal. Ru is particularly useful due to its properties when oxidized. However, Ru is particularly difficult to remove. In block 108, a main conductor is formed over the interface layer. In one embodiment, the main conductor includes Cu.

In block 110, in one embodiment, the main conductor is recessed selectively to the interface layer and the barrier layer and is wet etched to a position below a top surface of the dielectric layer.

In block 112, the interface layer is wet etched selectively to the main conductor and the barrier layer using a chemical composition having an oxidizer, wherein the chemical composition is buffered to include a pH of 4 and above, preferably basic and more preferably about 9. The wet etch of the interface layer can be performed using a chemical composition that includes the oxidizer, a buffer agent, a pH adjusting agent in an amount sufficient to provide the pH of 4 and above, preferably basic and more preferably about 9. In particular, the chemical composition can include about 10 mM periodic acid as the oxidizer, about 10 mM boric acid as the buffer agent and KOH as the pH adjusting agent in an amount sufficient to provide the pH (e.g., basic, but preferably about 9). A pH 4 and above may be employed. For the embodiments described, basic pHs are preferred to avoid possible toxic product formation.

In particularly useful embodiments, the oxidizer can include periodic acid, potassium periodate, sodium periodate; the buffer agent can include boric acid and the pH adjusting agent can include potassium hydroxide, sodium hydroxide, or lithium hydroxide (or combinations or these materials). In one embodiment, the wet etch process can be employed at room temperature, although elevated temperatures up to about 65° C. can also be employed. The wet etch mixture can also include, e.g., 10 mM potassium periodate as oxidizer, 10 mM sodium periodate as the buffer agent and with NaOH as the pH adjusting agent.

In another embodiment, the method path begins with block 104 and proceeds with block 120. In this embodiment, the interface layer and the main conductor are etched together and selectively to the barrier layer. In block 120, the main conductor and the interface layer are concurrently recessed selectively to the barrier layer to a position below a top surface of the dielectric layer. The recess includes wet etching using a chemical composition having an oxidizer and complexing agent, wherein the chemical composition is buffered to include a pH (e.g., basic, preferably about 9). A pH 4 and above may be employed.

In one embodiment, the chemical composition includes the oxidizer, the complexing agent, a buffer agent, and a pH adjusting agent in an amount sufficient to provide the pH of about 9. In particular, the chemical composition can include about 10 mM periodic acid as the oxidizer, about 10 mM boric acid as the buffer agent, about 2.5 mM 2-amino-butyric as the complexing agent and KOH as the pH adjusting agent in an amount sufficient to provide a pH (e.g., basic, preferably about 9). A pH 4 and above may be employed.

The interface layer can include ruthenium (Ru) and the main conductor can include copper (Cu). The wet etch can include an etch selectivity rate of Ru:Cu of a rate of about 3:1.

In block 122, the barrier layer is etched selectively to the main conductor and the interface layer. The barrier layer can be etched to a same level as a common surface of the main conductor and the interface layer where the same level as the common surface is below the top surface of the dielectric layer.

In block 124, processing can continue with the formation of additional dielectric layers and metal structures which can include the same materials and structures as described or other materials and structures. The recessed metals provide a topographical feature that can be employed for self-aligning subsequent contacts or metal lines as needed.

Having described preferred embodiments for wet etch removal of Ru selective to other metals (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a conductive structure for a semiconductor device, comprising:
   depositing a barrier layer in a trench formed in a dielectric material;
   forming an interface layer over the barrier layer;
   forming a main conductor over the interface layer;
   recessing the main conductor selectively to the interface layer and the barrier layer to a position below a top surface of the dielectric layer;
   wet etching the interface layer selectively to the main conductor and the barrier layer using a chemical composition having an oxidizer, wherein the chemical composition is buffered to include a pH above 7; and
   etching the barrier layer selectively to the main conductor and the interface layer.

2. The method as recited in claim 1, wherein the interface layer includes ruthenium (Ru).

3. The method as recited in claim 2, wherein wet etching the interface layer includes wet etching the interface layer wherein the chemical composition includes the oxidizer, a buffer agent, a pH adjusting agent in an amount sufficient to provide a pH of greater than 7.

4. The method as recited in claim 3, wherein wet etching the interface layer includes wet etching the interface layer wherein the chemical composition includes about 10 mM periodic acid as the oxidizer, about 10 mM boric acid as the buffer agent and KOH as the pH adjusting agent in an amount sufficient to provide a pH of about 9.

5. The method as recited in claim 3, wherein wet etching the interface layer includes wet etching the interface layer wherein the chemical composition includes about 10 mM potassium periodate as the oxidizer, about 10 mM sodium periodate as the buffer agent and NaOH as the pH adjusting agent in an amount sufficient to provide a pH of between 7 and 11.

6. The method as recited in claim 2, wherein the barrier layer includes TaN and the main conductor includes Cu.

7. The method as recited in claim 1, wherein etching the barrier layer selectively to the main conductor and the interface layer includes etching the barrier layer to a same level as a common surface of the main conductor and the interface layer.

8. The method as recited in claim 1, wherein the same level as the common surface is below the top surface of the dielectric layer.

9. A method for forming a conductive structure for a semiconductor device, comprising:
- depositing a barrier layer in a trench foil led in a dielectric material;
- forming a ruthenium (Ru) interface layer over the barrier layer;
- forming a main conductor over the interface layer;
- recessing the main conductor selectively to the interface layer and the barrier layer to a position below a top surface of the dielectric layer;
- wet etching the interface layer selectively to the main conductor and the barrier layer using a chemical composition including an oxidizer, a buffer agent, a pH adjusting agent in an amount sufficient to provide a basic pH; and
- etching the barrier layer selectively to the main conductor and the interface layer.

10. The method as recited in claim 9, wherein wet etching the interface layer includes wet etching the interface layer wherein the chemical composition includes about 10 mM periodic acid as the oxidizer, about 10 mM boric acid as the buffer agent and KOH as the pH adjusting agent in an amount sufficient to provide the pH of about 9.

11. The method as recited in claim 9, wherein wet etching the interface layer includes wet etching the interface layer wherein the chemical composition includes about 10 mM potassium periodate as the oxidizer, about 10 mM sodium periodate as the buffer agent and NaOH as the pH adjusting agent in an amount sufficient to provide a pH of between 7 and 11.

12. The method as recited in claim 9, wherein the barrier layer includes TaN and the main conductor includes Cu.

13. The method as recited in claim 9, wherein etching the barrier layer selectively to the main conductor and the interface layer includes etching the barrier layer to a same level as a common surface of the main conductor and the interface layer, wherein the same level as the common surface is below the top surface of the dielectric layer.

14. A method for forming a conductive structure for a semiconductor device, comprising:
- depositing a barrier layer in a trench formed in a dielectric material;
- forming an interface layer over the barrier layer;
- forming a main conductor over the interface layer;
- concurrently recessing the main conductor and the interface selectively to the barrier layer to a position below a top surface of the dielectric layer by wet etching using a chemical composition having an oxidizer and complexing agent, wherein the chemical composition is buffered to include a basic pH; and
- etching the barrier layer selectively to the main conductor and the interface layer.

15. The method as recited in claim 14, wherein the interface layer includes ruthenium (Ru) and the main conductor includes copper (Cu).

16. The method as recited in claim 14, wherein wet etching the interface layer includes wet etching the interface layer wherein the chemical composition includes the oxidizer, the complexing agent, a buffer agent, and a pH adjusting agent in an amount sufficient to provide the pH between 7 to 11.

17. The method as recited in claim 16, wherein wet etching the interface layer includes wet etching the interface layer wherein the chemical composition-includes about 10 mM periodic acid as the oxidizer, about 10 mM boric acid as the buffer agent, about 2.5 mM 2-amino-butyric acid as the complexing agent and KOH as the pH adjusting agent in an amount sufficient to provide the pH of about 9.

18. The method as recited in claim 14, wherein wet etching includes wet etching the interface layer and the main conductor at a rate of 3:1.

19. The method as recited in claim 14, wherein etching the barrier layer selectively to the main conductor and the interface layer includes etching the barrier layer to a same level as a common surface of the main conductor and the interface layer.

20. A method for forming a conductive structure for a semiconductor device, comprising:
- depositing a barrier layer in a trench formed in a dielectric material;
- forming a ruthenium (Ru) interface layer over the barrier layer;
- forming a copper (Cu) main conductor over the interface layer;
- concurrently recessing the main conductor and the interface selectively to the barrier layer to a position below a top surface of the dielectric layer by wet etching using a chemical composition having an oxidizer, a buffer agent, a complexing agent and a pH adjusting agent in an amount sufficient to provide a basic pH; and
- etching the barrier layer selectively to the main conductor and the interface layer.

21. The method as recited in claim 20, wherein the chemical composition includes about 10 mM periodic acid as the oxidizer, about 10 mM boric acid as the buffer agent, about 2.5 mM 2-amino-butyric as the complexing agent and KOH as the pH adjusting agent in an amount sufficient to provide the pH of about 9.

22. The method as recited in claim 20, wherein wet etching includes wet etching the interface layer and the main conductor at a rate of 3:1.

* * * * *